United States Patent
Bass et al.

(10) Patent No.: US 7,816,203 B1
(45) Date of Patent: Oct. 19, 2010

(54) METHOD FOR FABRICATING A SEMICONDUCTOR DEVICE

(75) Inventors: William Scott Bass, Bastrop, TX (US); Mark R. Breen, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 805 days.

(21) Appl. No.: 11/378,464

(22) Filed: Mar. 16, 2006

(51) Int. Cl.
*H01L 21/336* (2006.01)

(52) U.S. Cl. .................. 438/257; 438/261; 438/288; 257/E21.679; 257/E27.103

(58) Field of Classification Search .......... 438/197, 438/586, 623, 723, 687
See application file for complete search history.

(56) References Cited

U.S. PATENT DOCUMENTS

| | | | |
|---|---|---|---|
| 6,774,432 B1 | 8/2004 | Ngo et al. | |
| 7,442,998 B2 * | 10/2008 | Wei et al. | 257/391 |
| 2004/0175926 A1 * | 9/2004 | Wang et al. | 438/627 |
| 2006/0128166 A1 * | 6/2006 | Nakata et al. | 438/795 |

OTHER PUBLICATIONS

Quirk et al. "LPCVD (Low pressure CVD)", Semiconductor Manufacturing Technology, Prentice-Hall 2001, p. 271, 273-274.*
Quirk et al., "Spin-On-Dielectrics," Semiconductor Manufacturing Technology, prentice-Hall, 2001, p. 287, Spin-on-Glass section; second paragraph, line 4).*

* cited by examiner

*Primary Examiner*—W. David Coleman
*Assistant Examiner*—Shaka Scarlett

(57) ABSTRACT

A method is provided for fabricating a semiconductor device having a gate electrode overlying a gate insulator. The method, in accordance with one embodiment, comprises depositing a layer of spin on glass overlying the gate electrode, the layer of spin on glass comprising a substantially UV opaque material. The layer of spin on glass is heated to a temperature less than about 450° C., and all subsequent process steps in the fabrication of the device are limited to temperatures less than about 450° C.

12 Claims, 3 Drawing Sheets

METHOD FOR FABRICATING A SEMICONDUCTOR DEVICE

TECHNICAL FIELD

The present invention generally relates to methods for fabricating a semiconductor device, and more particularly relates to methods for fabricating a semiconductor device that incorporates an ultraviolet radiation blocking layer.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate structure that overlies a channel separating spaced apart source and drain regions between which a current can flow. The typical IC includes a plurality of conductive layers that selectively interconnects the MOS transistors, routes power supply voltages, input/output signals, clock signals, and the like to implement the intended circuit function. The conductive layers are separated by dielectric layers (ILDs) that provide electrical isolation between unrelated conductive layers. A wide variety of insulating materials can be used as ILD layers, including oxides, nitrides, oxynitrides, high dielectric constant insulators, low dielectric constant insulators, and the like, as well as multiple layers of these materials sandwiched together, as the circuit needs dictate. The conductive layers are usually formed from metals or from doped polycrystalline silicon.

When operating properly, voltages associated with the gate structure, either from charges stored on the gate structure or from voltages applied to the gate structure, control the flow of current through the channel between the source and drain regions. Unfortunately, inadvertently stored charge can change the conductive state of some of the MOS transistors or can cause a parasitic MOS transistor to become conductive, and such can cause the IC to operate incorrectly. The inadvertently stored charge can be stored on one of the conductive layers, on one of the dielectric layers, or at an interface between two of the dielectric layers. One source of the inadvertent charge is ultraviolet (UV) radiation resulting from certain process steps used in the fabrication of the IC. The UV radiation can cause the creation of hole-electron pairs with the subsequent storage of either the hole or the electron. The UV radiation can result, for example, from plasma processing during either etch or deposition steps. Plasma etching and plasma enhanced chemical vapor deposition (PECVD) are common process tools used in IC fabrication.

The inadvertently storage of charge is especially problematic in nonvolatile memory devices such as electrically erasable programmable read only memories (EEPROM) and flash memories, and most especially in nonvolatile programmable memories of the conductor-oxide-nitride-oxide-semiconductor (SONOS or MONOS) type. In the proper operation of such memories charge is either stored or not stored on the nitride layer of the gate structure to indicate the storage of a one or a zero. In other nonvolatile programmable memories charge can be stored on a polycrystalline silicon layer that is sandwiched between two insulator layers. The generation of inadvertent charge by UV radiation that is trapped on the nitride or polycrystalline silicon layer may cause the storage of incorrect information. Similar problems can occur with other types of nonvolatile memories such as those employing polymer gate storage regions.

One method to avoid the generation of UV radiation induced charge generation is to deposit, by chemical vapor deposition (CVD), a UV radiation blocking insulator overlying the gate structure. Such a method is disclosed in U.S. Pat. No. 6,774,432. The UV radiation blocking layer prevents the radiation caused by any subsequent fabrication step from reaching the gate structure and hence prevents the generation of charges that can collect on the gate structure. Although the chemical vapor deposition of such a blocking layer is successful in preventing the generation and collection of charges on the gate structure, such blocking layers are difficult to etch, thus leading to long process times and undesirable etch profiles.

Accordingly, it is desirable to provide methods for fabricating semiconductor devices that overcome the problems associated with previous UV blocking techniques and that provide method steps for forming a UV radiation blocking layer that is easy to etch. In addition, it is desirable to provide methods, in accordance with one embodiment of the invention, for fabricating semiconductor devices that include a UV radiation blocking layer that is compatible with copper metallization. Furthermore, other desirable features and characteristics of the present invention will become apparent from the subsequent detailed description and the appended claims, taken in conjunction with the accompanying drawings and the foregoing technical field and background.

BRIEF SUMMARY

A method is provided for fabricating a semiconductor device having a gate electrode overlying a gate insulator. The method, in accordance with one embodiment, comprises depositing a layer of spin on glass overlying the gate electrode, the layer of spin on glass comprising a substantially UV opaque material. The layer of spin on glass is heated to a temperature less than about 450° C., and all subsequent process steps in the fabrication of the device are limited to temperatures less than about 450° C.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-7 illustrate, in cross section, process steps for fabricating a semiconductor device 20 in accordance with various embodiments of the invention. Device 20, for illustrative purposes only, will be depicted as a nonvolatile memory device of the Semiconductor-Oxide-Nitride-Oxide-Semiconductor (SONOS) type although the various embodiments of the invention are equally applicable to other type of nonvolatile memory devices and, in general, to other types of semiconductor devices, especially MOS devices. The term "MOS device" properly refers to a device having a metal gate electrode and an oxide gate insulator, but that term will be used throughout to refer to any semiconductor device that includes a conductive gate electrode (whether metal or other conductive material) that is positioned over a gate insulator (whether oxide or other insulator or combination of insulators) which, in turn, is positioned over a semiconductor substrate. In these figures only a single SONOS transistor is illustrated, but those of skill in the art will appreciate that device 20 may include a plurality of transistors, both volatile and nonvolatile, as needed to implement a desired circuit function. Various steps in the manufacture of semiconductor devices are well known and so, in the interest of brevity, many conventional steps will only be mentioned briefly herein or will be omitted entirely without providing the well known process details. Although in these illustrative embodiments only a single N-channel transistor is illustrated, the invention is also applicable to the fabrication of complementary MOS (CMOS) devices and circuits.

Figure 1:
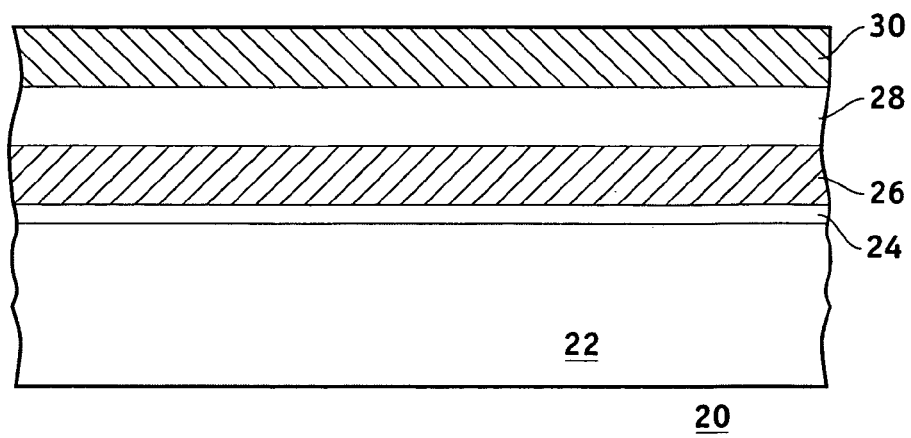
FIGS. 1-8 illustrate schematically, in cross section, process steps for fabricating a semiconductor device in accordance with various embodiments of the invention.

As illustrated in FIG. 1, the method in accordance with one embodiment of the invention begins by providing a semiconductor substrate 22. The semiconductor substrate is preferably a silicon substrate, and may be a bulk monocrystalline silicon substrate as illustrated or may be a silicon on insulator (SOI) substrate (not illustrated) in which a thin monocrystalline silicon layer is formed overlying a monocrystalline silicon carrier substrate with an intervening insulating layer. As used herein, the terms "silicon layer" and "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. Dielectric isolation regions (not illustrated) can be formed in the semiconductor substrate, for example by shallow trench isolation (STI) techniques, to provide electrical isolation between devices as required by the circuit being implemented.

As further illustrated in FIG. 1, the method continues by forming sequentially a layer of tunnel oxide 24, a charge storage layer 26, a further layer of oxide 28, and a layer of polycrystalline silicon 30. Although there are many different methods for forming these layers, as is well known to those of skill in the art, only one exemplary method will be discussed. It is not intended, however, that the invention be limited to this exemplary method. In accordance with one embodiment of the invention, tunnel oxide layer 24 can be silicon dioxide grown by thermal oxidation of substrate 22. The tunnel oxide can have a thickness of about 1-5 nanometers (nm). Charge storage layer 26 can be silicon nitride deposited by chemical vapor deposition (CVD) by the reaction of dichlorosilane and ammonia, and can have a thickness of about 4-10 nm. Further layer of oxide 28 can be a silicon dioxide layer deposited by CVD from, for example, a silane or tetraethylorthosilicate source to a thickness of about 1-5 nm. Polycrystalline silicon layer 30 can also be deposited by CVD to a thickness of about 50-150 nm by the reduction of silane. Other insulating materials can be substituted for the exemplary oxide, nitride and oxide layers.

Figure 2:
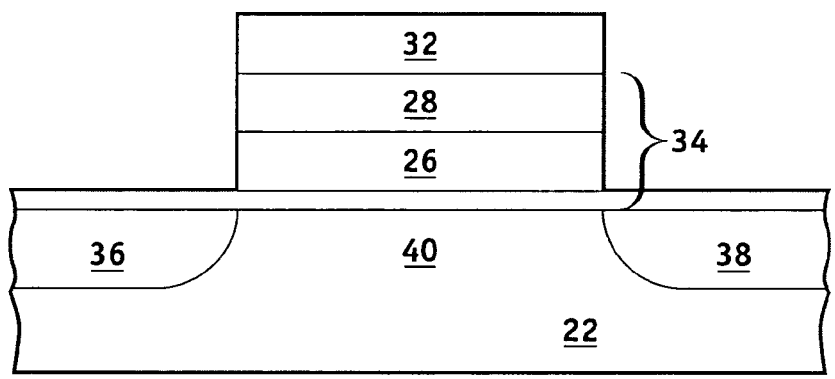

As illustrated in FIG. 2, the method in accordance with an embodiment of the invention continues by the photolithographic patterning and etching of polycrystalline silicon layer 30 to form a control gate electrode 32. The patterning of control gate electrode 32 is followed by the patterning of layers 28 and 26 to form an oxide-nitride-oxide (ONO) gate insulator stack 34 underlying the control gate electrode. Preferably tunnel oxide layer 24 is not etched at this time. Source region 36 and drain region 38 are formed in semiconductor substrate 22 by ion implantation through the remaining exposed portion of tunnel oxide layer 24. The spaced apart source and drain regions are formed in self alignment with control gate electrode 32 and gate insulator stack 34 and define a channel region 40 at the surface or the semiconductor substrate. For an N-channel MONOS device the source and drain regions can be formed by ion implanting arsenic or phosphorus ions. Sidewall spacers (not illustrated) may also be formed on the edges of the gate insulator stack and those spacers may be used as an ion implantation mask for additional source and drain region implantations.

Figure 3:
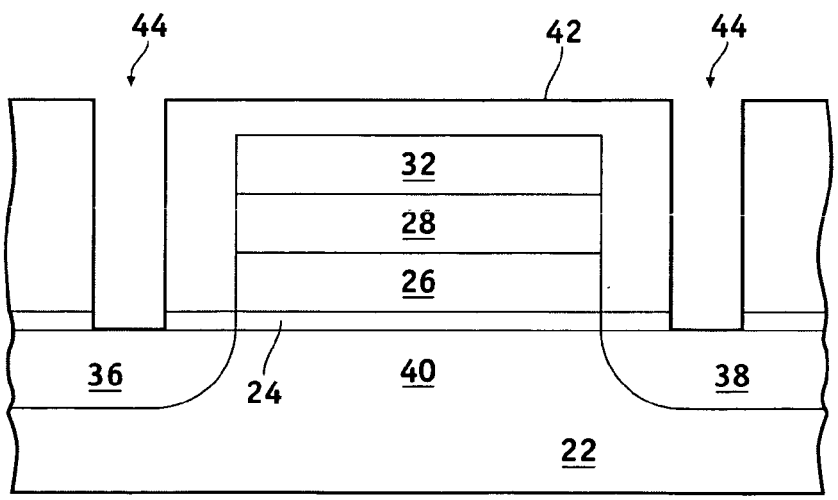

As illustrated in FIG. 3, a layer of insulating material 42 can be deposited overlying the control gate electrode, gate insulator stack, and source and drain regions. The insulating material can be, for example, a layer of silicon oxide deposited by a CVD or low pressure CVD (LPCVD) process. The layer of insulating material is deposited to a thickness greater than the combined thickness of the control gate electrode and the ONO gate insulator stack and is subsequently planarized, for example by chemical mechanical planarization (CMP). Contact openings 44 are etched through the planarized layer of insulating material 42 to expose a portion of the surface of source region 36 and drain region 38. Although not illustrated, a silicide layer can be formed on a portion of the surface of the source and drain regions, either before the deposition of layer of insulating material 42 or after the etching of contact openings 44.

Figure 4:
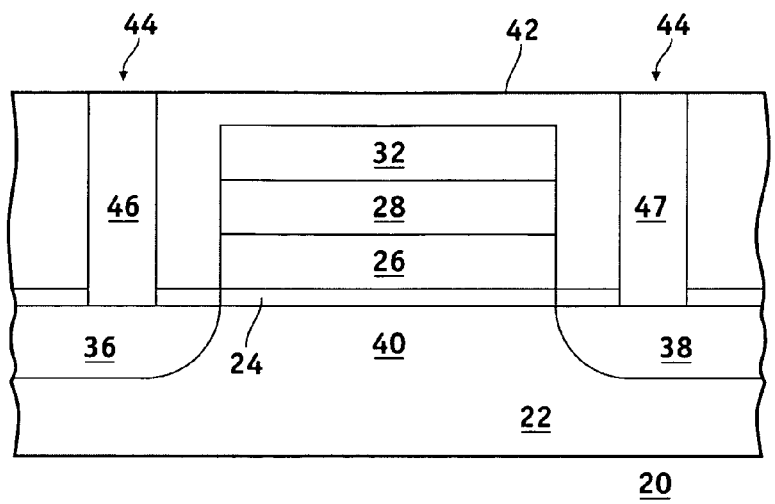

Conductive plugs 46 and 47 can be formed in contact openings 44, for example by depositing a layer of titanium, forming a layer of titanium nitride, and then filling the contact openings with tungsten. Excess titanium, titanium nitride, and tungsten deposited on the upper surface of layer of insulating material 42 can be removed by CMP. The resulting structure, after the CMP, is as illustrated in FIG. 4 with conductive plugs 46 and 47 electrically contacting source region 36 and drain region 38, respectively.

Figure 5:
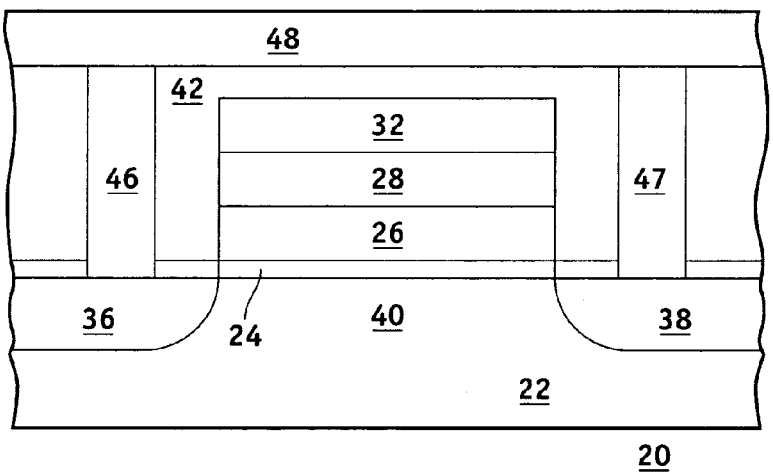

In accordance with an embodiment of the invention, a layer of spin on glass 48 is applied over the planarized surface of the layer of insulating material 42 and contact plugs 46 as illustrated in FIG. 5. The spin on glass is formed of a material that is substantially opaque to UV radiation. By substantially opaque to UV radiation is meant that the film blocks at least about 95% of incident UV radiation. One suitable spin on glass material is Ensemble SA 248 available from Dow Chemical Co. of Midland, Mich. This particular spin on glass material forms a silicon oxide film. The layer of spin on glass is applied by spin deposition using standard spin on glass application techniques as supplied by the manufacturer. Following the spin on application, the film layer is heated to a temperature between about 350° C. and about 450° C. to drive off volatile solvents and to densify the film. After the heating step, layer of spin on glass 48 preferably has a thickness of about 50-150 nm. Subsequently heating layer of spin on glass 48 to a temperature greater than about 450° C. may cause the layer to deteriorate, so preferably all subsequent processing steps used in the fabrication of device 20 are limited to temperatures less than about 450° C.

Figure 6:
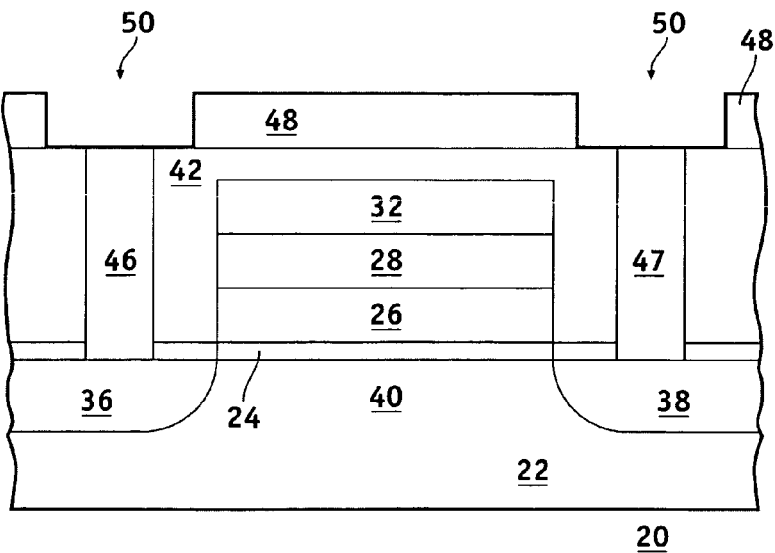

As illustrated in FIG. 6, the layer of spin on glass can be patterned and etched to form trenches 50 which will be used to form a first layer of interconnect metallization by a damascene process. The layer of spin on glass can be etched, for example, by a silicon oxide plasma etch process. Aluminum metallization, often used for interconnect metallization of devices in an integrated circuit, usually involves an annealing step at a temperature greater than 450° C. Accordingly, it is advantageous, in accordance with an embodiment of the invention, to use copper metallization for the interconnect metallization. Trenches 50, etched into the layer of spin on glass, are aligned with conductive plugs 46 and 47.

Figure 7:
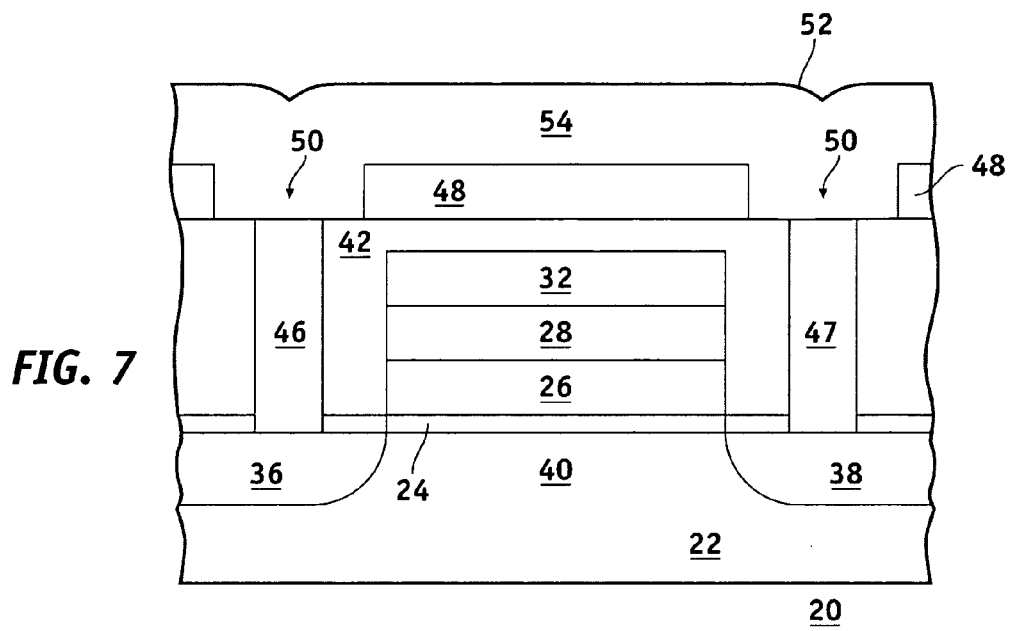

As illustrated in FIG. 7, trench 50 is filled with a layer of copper metallization 52, preferably by either an electroless or an electrolytic deposition process. A conductive liner (not illustrated) such as a layer of tantalum or the like may be deposited into the trench before the copper metallization is deposited. The deposition method for filling the trench with copper metallization does not require a high temperature anneal as is usually used with aluminum metallization. As illustrated, the copper metallization deposition process results in the deposition of the copper metallization both filling trench 50 and also depositing copper metallization 54 overlying the spin on glass layer. Copper metallization 52 makes electrical contact with conductive plugs 46 and 47. The copper metallization can be pure copper or an alloy or mixture that is predominantly copper.

Figure 8:
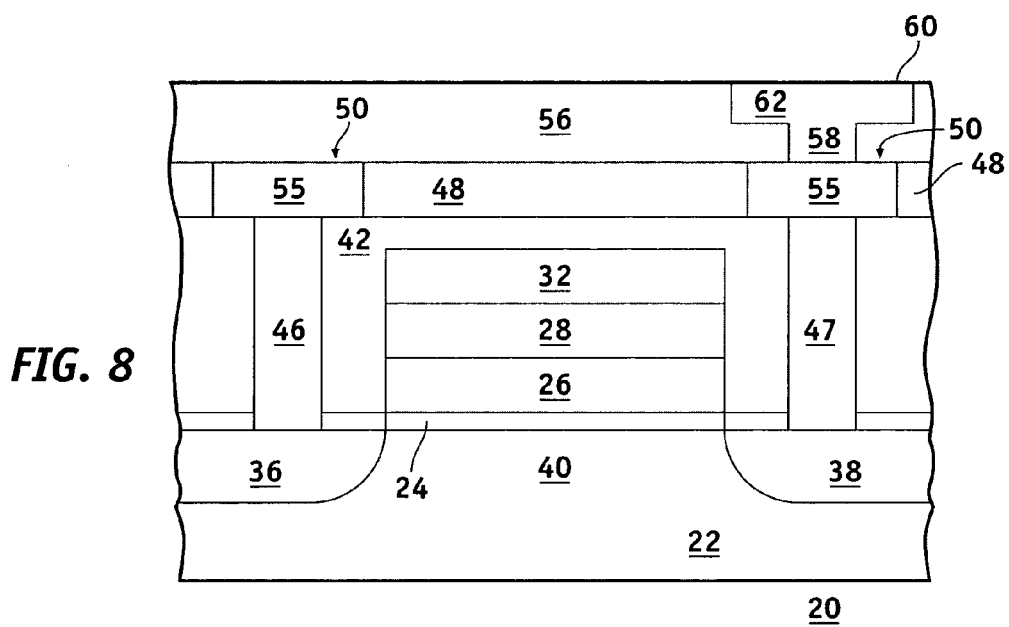

As illustrated in FIG. 8, copper metallization 54 along with any conductive liner overlying the spin on glass layer can be removed by CMP to leave copper metallization 55 filling trenches 50 as a first level interconnect metallization. If necessary for the particular circuit being implemented, an additional layer 56 of dielectric insulator can then be deposited overlying copper interconnect metallization 55 and layer of spin on glass 48. Because layer of spin on glass 48 is substantially opaque to UV radiation, layer 56 and any subsequent layers can be deposited or etched using any low temperature process (less than about 450° C.) including plasma processing because any UV radiation produced by such process will be blocked from the gate insulator. Layer 56 can be photolithographically patterned and etched to form an opening 58 extending through layer 56 to expose a portion of the underlying copper interconnect metallization and to form a trench 60 suitable for forming a second level of interconnect metallization by a damascene process. Copper metallization is deposited to fill opening 58 and trench 60. The excess copper is subsequently removed by a CMP process to leave a second level of copper interconnect metallization 62 filling opening 58 and trench 60 and selectively electrically contacting copper metallization 55.

Figure 9:
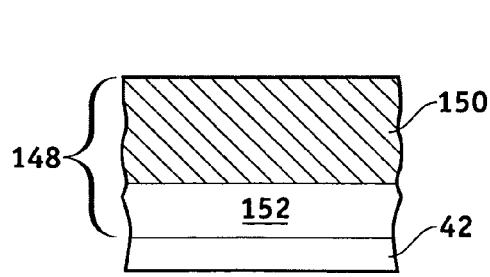
FIGS. 9 and 10 illustrate, in cross section, alternate structures for a UV blocking layer in accordance with various embodiments of the invention.
Figure 10:
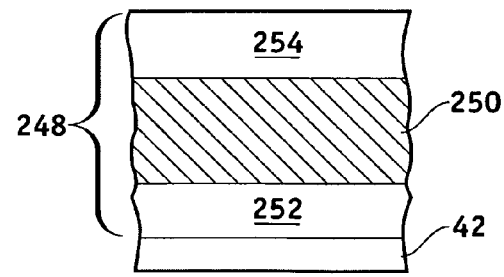

In FIGS. 5-8 the UV blocking layer 48 has been disclosed as a single layer of spin on glass containing a substantially UV opaque material overlying a dielectric layer which, in turn, is formed overlying the gate structure of device 20. FIGS. 9 and 10 illustrate schematically, in cross section, UV blocking layers implemented in accordance with further embodiments of the invention. In these figures only the dielectric layer and the blocking layer are illustrated. Other steps in the fabrication of a semiconductor device can be carried out as previously described or in accordance with any conventional semiconductor device fabrication process.

FIG. 9 illustrates a UV blocking layer 148 in accordance with one embodiment of the invention. UV blocking layer 148 includes a layer 150 of spin on glass material containing a substantially UV opaque material that is formed overlying a layer 152 of oxide or other dielectric material. Layer 150 can be formed in the same manner as described above for layer 48. Layer 152 can be formed by CVD or LPCVD and can be silicon oxide, silicon nitride, silicon oxynitride, or the like. Layer 150 can have a thickness, for example, of between about 50 and 150 nm and layer 152 can have a thickness, for example, of between about 50 and 500 nm. The thickness of the two layers can be selected for ease of processing, subject to being sufficiently thick to provide the desired UV blocking ability.

FIG. 10 illustrates a UV blocking layer 248 in accordance with a further embodiment of the invention. UV blocking layer 248 includes a layer 250 of spin on glass material containing a substantially UV opaque material that is formed between two layers 252 and 254 of oxide or other dielectric material. Layer 250 can be formed in the same manner as described above for layer 48. Layer 252, formed below layer 250, can be formed by CVD or LPCVD and can be silicon oxide, silicon nitride, silicon oxynitride, or the like. Layer 254, formed over layer 250, can be formed by any conventional low temperature (less than about 450° C.) deposition process and can be silicon oxide, silicon nitride, silicon oxynitride, or the like. The thickness of the three layers can be selected for ease of processing, subject to being sufficiently thick to provide the desired UV blocking ability.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor device overlying a semiconductor substrate, the method comprising the steps of:
   forming an oxide-nitride-oxide (ONO) gate insulator stack overlying the substrate;
   depositing a gate electrode overlying the ONO gate insulator stack;
   depositing a layer of insulating material overlying the gate electrode;
   depositing a layer of spin on glass overlying and in contact with the layer of insulating material, the layer of spin on glass having a surface and comprising a substantially ultraviolet opaque material;
   etching a trench into the layer of spin on glass;
   depositing a layer of copper overlying the surface of the layer of spin on glass and filling the trench; and
   removing the layer of copper overlying the surface of the layer of spin on glass.

2. The method of claim 1 further comprising the step of heating the layer of spin on glass to a temperature between about 350° C. and 450° C. prior to the step of etching a trench.

3. The method of claim 2 further comprising the steps of:
   depositing a dielectric layer overlying the layer of copper filling the trench;
   etching an opening through the dielectric layer to expose a portion of the layer of copper filling the trench; and
   depositing a second layer of copper filling the opening and electrically contacting the portion of the layer of copper filling the trench.

4. The method of claim 3 wherein all steps subsequent to the step of heating the layer of spin on glass are conducted at temperatures less than 450° C.

5. A method for fabricating a semiconductor device in and overlying a semiconductor substrate, the method comprising the steps of:
   forming a gate dielectric layer overlying the semiconductor substrate;

depositing a silicon nitride layer overlying the gate dielectric layer;

forming a silicon oxide layer overlying the silicon nitride layer;

depositing a polycrystalline silicon layer overlying the silicon oxide layer;

patterning the polycrystalline silicon layer, silicon oxide layer and silicon nitride layer to form a gate stack;

ion implanting conductivity determining dopant ions to form a source region and a drain region self aligned to the gate stack;

depositing a planarized insulating layer overlying the gate stack, the source region and the drain region;

etching contact openings in the planarized insulating layer to expose a portion of the source region and a portion of the drain region;

forming conductive plugs in the contact openings electrically contacting the source region and the drain region respectively;

depositing a spin on glass layer overlying the gate stack, the source region and the drain region, the spin on glass layer having an upper surface and comprising a substantially ultraviolet opaque material; and etching openings through the spin on glass layer to align with the conductive plugs.

6. The method of claim 5 further comprising the step of densifying the spin on glass layer by heating to a temperature between about 350° C. and about 450° C. prior to the step of etching openings.

7. The method of claim 5 further comprising the step of depositing a second insulating layer in contact with the upper surface of the layer of spin on glass.

8. The method of claim 5 further comprising the step of chemical vapor depositing a layer of silicon oxide in contact with the upper surface of the layer of spin on glass.

9. The method of claim 5 wherein the planarized insulating layer is deposited by a low pressure chemical vapor deposition process overlying the gate stack, the source region and the drain region prior to the step of depositing a spin on glass layer.

10. A method for fabricating a semiconductor device overlying a semiconductor substrate, the method comprising the steps of:

forming an oxide-nitride-oxide (ONO) gate insulator stack overlying the substrate;

depositing a gate electrode overlying the ONO gate insulator stack;

depositing a first layer of insulating material overlying the gate electrode;

depositing a layer of spin on glass overlying and in contact with the first layer of insulating material, the layer of spin on glass having a surface and comprising a substantially ultraviolet opaque material;

heating the layer of spin on glass to a temperature between about 350° C. and 450° C.; and limiting all subsequent process steps to temperatures less than 450° C.

11. The method of claim 10 further comprising the step of chemical vapor depositing a second layer of insulating material overlying the layer of spin on glass.

12. The method of claim 10 further comprising the steps of:

etching a trench extending into the layer of spin on glass; and filling the trench with a metal comprising copper, wherein the metal is electrically contacting the gate electrode.

* * * * *